United States Patent [19]
Jolly et al.

[11] Patent Number: 5,395,508
[45] Date of Patent: Mar. 7, 1995

[54] APPARATUS FOR THE ELECTROLYTIC DEPOSITION OF A METAL ON A WEAKLY CONDUCTIVE FLEXIBLE SUBSTRATE ELECTROLYTIC DEPOSITION PROCESS AND PRODUCT OBTAINED BY THIS PROCESS

[75] Inventors: Renaud Jolly; Jacques Legrand; Cornélia Petrescu, all of Grenoble, France

[73] Assignee: Commissariat A L'Energie Atomique, Paris, France

[21] Appl. No.: 130,549

[22] Filed: Oct. 1, 1993

[30] Foreign Application Priority Data

Oct. 5, 1992 [FR] France .................. 92 11766

[51] Int. Cl.$^6$ .................. C25D 3/00; C25D 17/00
[52] U.S. Cl. .................. 205/129; 205/135; 205/136; 204/224 R; 204/202; 204/206
[58] Field of Search ............ 205/50, 129, 135, 136, 205/147, 122; 204/224 R, 202, 206

[56] References Cited

U.S. PATENT DOCUMENTS

| | | | |
|---|---|---|---|
| 3,723,283 | 3/1973 | Johnson et al. | 204/206 |
| 4,409,924 | 10/1983 | Laverty et al. | 118/406 |
| 4,921,583 | 5/1990 | Sewell et al. | 204/224 R |

*Primary Examiner*—Kathryn Gorgos
*Attorney, Agent, or Firm*—Burns, Doane, Swecker & Mathis

[57] ABSTRACT

Apparatus and method for the electrolytic deposition of a metal on a weakly conductive, flexible substrate such as a textile or a paper sheet for the manufacture of flexible heating elements such as heated gloves, heated car seats, panels used in construction for the heating of rooms, etc. Metallic circuits of varying shapes can be formed on the weakly conductive, flexible substrate.

16 Claims, 5 Drawing Sheets

APPARATUS FOR THE ELECTROLYTIC DEPOSITION OF A METAL ON A WEAKLY CONDUCTIVE FLEXIBLE SUBSTRATE ELECTROLYTIC DEPOSITION PROCESS AND PRODUCT OBTAINED BY THIS PROCESS

FIELD OF THE INVENTION

The present invention relates to an apparatus for the electrolytic deposition of a metal on a weakly conductive, flexible substrate, as well as to an electrolytic deposition process and to a product obtained by said process. The weakly conductive, flexible substrate can e.g., be a textile or a paper sheet impregnated with a conductive material, such as e.g., carbon black or a conductive polymer. The term metal deposition also covers the deposition of alloys.

The invention more particularly applies to the production of metallic circuits of varying shapes on weakly conductive textiles, i.e., whose square resistance can reach 10,000 ohms.

Thus, the production of copper or nickel circuits on a textile impregnated by an electronically conductive polymer makes it possible to obtain flexible heating elements. The latter are then used in the manufacture of heated gloves, heated car seats, or panels used in construction for the heating of rooms.

BACKGROUND OF THE INVENTION

The prior art already discloses processes and apparatuses making it possible to produce such electrolytic metal deposits on weakly conductive substrates.

Japanese patent application JP-60-228697 of Nov. 13, 1985 describes an apparatus making it possible to metallize semiconductor substrates. The substrate is placed at the upper opening of an electrolytic deposition cell. Its rear face is in contact with a planar electrode, which closes the cell and forms the cathode. The anode is placed in the electrolytic deposition cell and faces said substrate. The application of an electric current to the two terminals of the electrodes makes it possible to produce the deposit.

This apparatus suffers from the disadvantage of only being useable with a rigid substrate in order that its rear face is kept in contact with the planar cathode and can rest on the edge or ledge of the electrolytic deposition cell. This apparatus also does not make it possible to produce deposits of varying shapes, e.g., by leaving part of the substrate uncoated. Finally, semicontinuous deposits cannot be produced with this apparatus, because it is necessary to dismantle the cathode at the end of each deposition process in order to remove the coated substrate and put a new substrate into place.

French patent application FR-A-2 649 126 of Jun. 30 1989, describes a process for metallic electrochemical deposition on an electrically insulating material. As the substrate to be coated is insulating, prior to the metal deposition, it must be rendered conductive by the deposition on its surface of an electronically conductive polymer. It is then scarcely immersed in a solution of a salt of the metal to be deposited. A high voltage of several dozen volts is applied between the pretreated substrate serving as the cathode and an anode immersed in the electrolytic solution. If deposition takes place at the end of the substrate, the latter is gradually introduced into the solution, at the same time as the voltage applied is reduced. Finally, the substrate is kept at a voltage of a few volts for 30 to 45 minutes until a satisfactory deposit is obtained.

This process suffers from the disadvantage of being extremely slow and only permitting randomly shaped metal deposits by using a complex mask system. Thus, these two disadvantages render impossible a semicontinuous, rapid deposition.

Finally, US-A-3 723 283 (Johnson) discloses an electrodeposition apparatus making it possible to produce deposits having a specific shape on a material strip or fabric. The fabric is unrolled semi-continuously in front of several successive working stations, where it undergoes several treatments. This apparatus comprises two mobile deposition heads, which can move towards or away from one another in order to grip the fabric on which the deposition is made. The electrolyte to be deposited is passed through these deposition heads. However, if it is wished to modify the shape of the deposit made, the complete deposition head must be changed.

SUMMARY OF THE INVENTION

Therefore, the object of the invention is to obviate the aforementioned disadvantages. To this end, the invention relates to an apparatus for the electrolytic deposition of a metal on a weakly conductive, flexible substrate.

According to the invention, said apparatus comprises an electrolytic cell, a first and a second planar electrodes placed in said electrolytic cell and at least one element forming a mask placed between the two electrodes, said mask being produced from an electrically insulating material, having at least one opening having the shape of the deposit which it is wished to reproduce on said substrate and being provided with motor means permitting the displacement thereof between a first position where it is remote from the substrate to be treated and a second position where it is engaged against said substrate.

This apparatus makes it possible to produce a metal deposit having a random shape electrochemically on a weakly conductive flexible substrate in the mass (i.e., a substrate with a square resistance of up to 10,000 ohms). This deposit can be made in a minimum time and with a minimum number of operations. Thus, it is merely necessary to apply the mask for a relatively short deposition time and to remove it once the deposit has been made. During deposition, the substrate is gripped between the mask and the first electrode. Moreover, it is easily possible to change the mask in order to apply another mask having a different shape.

Advantageously, the dimensions of the first electrode are equal to or greater than those of the mask level with the mask periphery.

Thus, the fixing of the mask on the substrate (or more specifically on the substrate—first electrode assembly) guarantees an adequate sealing preventing any deposition on the face of the flexible substrate directed towards the first electrode, thereby eliminating short-circuit risks.

The invention also relates to a process for electrolytic deposition, characterized in that it comprises the following stages:

a) immersing said substrate in an electrolytic cell filled with an electrolyte, said weakly conductive, flexible substrate being positioned between the first and second electrodes also placed in said electrolytic cell, at least one of the said two electrodes being made from the metal which it is wished to deposit and constituting an anode;

b) maintaining one face of said substrate in contact with said first electrode;

c) placing between the opposite face of said substrate and the second electrode, an element made from an electrically insulating material and forming a mask, said mask having at least one opening corresponding to the shape of the deposit which it is wished to reproduce on said substrate;

d) moving said mask in order to engage it against said opposite face of the substrate by motor means, so that there is no electrolyte between the mask and the substrate;

e) applying a low voltage between the first and second electrodes so as to produce the deposit;

f) removing the mask using said motor means in order to obtain the substrate covered with the deposit; and g) passing the substrate semicontinuously between the first electrode and the mask and repeating stages d) to f) on successive portions of said substrate.

As a result of the semicontinuous movement of the strip and the lack of any need to remove the substrate for each deposition operation, it is possible to speed up the production process.

Finally, the invention relates to a product obtained by the aforementioned process. This product is characterized in that the substrate comprises an electrically insulating, textile support covered by a doped, electronically conductive, organic polymer and in that the deposited metal forms at least two comb-shaped electrodes. Another product is characterized in that the substrate is a doped, electronically conductive, organic polymer and in that the metal is deposited on two opposite lateral edges of said substrate, so as to form a continuous strip extended towards the median portion of the substrate by electrodes.

BRIEF DESCRIPTION OF THE DRAWING

The invention is described in greater detail hereinafter relative to a non-limitative embodiment and with reference to the attached drawings, wherein show.

DESCRIPTION OF THE PREFERRED EMBODIMENTS

Figure 1:
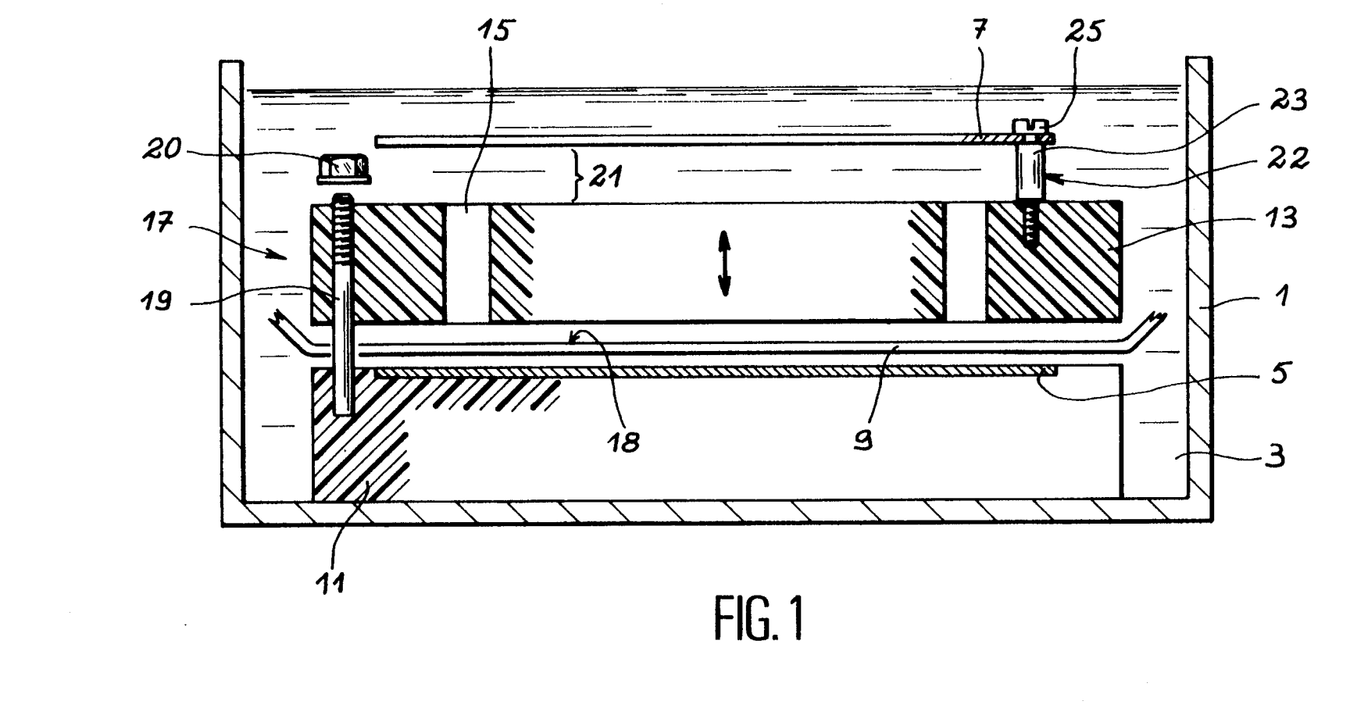
FIG. 1 A diagrammatic sectional view of a first embodiment of the deposition apparatus according to the invention.

As illustrated in FIG. 1, the electrolytic deposition apparatus according to the invention comprises an electrolytic cell 1 containing an electrolyte 3. In a conventional manner, a first electrode 5 and a second electrode 7 are placed within the cell 1. These planar electrodes are substantially rectangular. The electrode 7 serving as the anode is made from the metal which it is wished to deposit. For illustration purposes, said metal can be copper or nickel. The substrate to be treated 9 is placed within the cell 1 between the two electrodes 5 and 7. The substrate is only partly shown in order to simplify representation, but it is normally in the form of a continuous strip. As will be described in greater detail hereinafter, the electrode 5 rests on an insulating material plate 11.

An element forming a mask 13 made from an electrically insulating material is also located within the cell between the two electrodes 5 and 7 and more specifically between the substrate 9 and the second electrode 7. It is also possible to use a mask 13 formed from several portions. Preferably, the insulating material used is polypropylene. This mask 13 is in the form of a rectangular block having at least one opening 15 with the shape of the deposit which it is wished to reproduce on the substrate 9. The mask can best be seen in FIG. 2. The mask 13 makes it possible to produce deposits having various shapes on only certain portions of the substrate.

In order to produce these deposits, the mask 13 is pressed onto the substrate 9 with an adequate pressure to prevent the electrode 3 present in the cell from coming into contact with those portions of the substrate 9 which are not to be coated. In other words, the pressing of the mask 13 onto the substrate 9 is such that it ensures an adequate sealing such that the metal deposits are only produced on one face of the substrate with the desired geometry and dimension. Therefore, the mask 13 is provided with motor means 17 permitting the displacement thereof between a first position (illustrated in FIG. 1), where it is remote from the substrate 9 and a second position in which it is engaged against the upper face 18 of the substrate 9 on applying the latter against the first electrode 5. Thus, a metal deposit is not formed on the face of the substrate facing the first electrode. Such a deposit would risk causing short-circuits in the end product.

Figure 3:
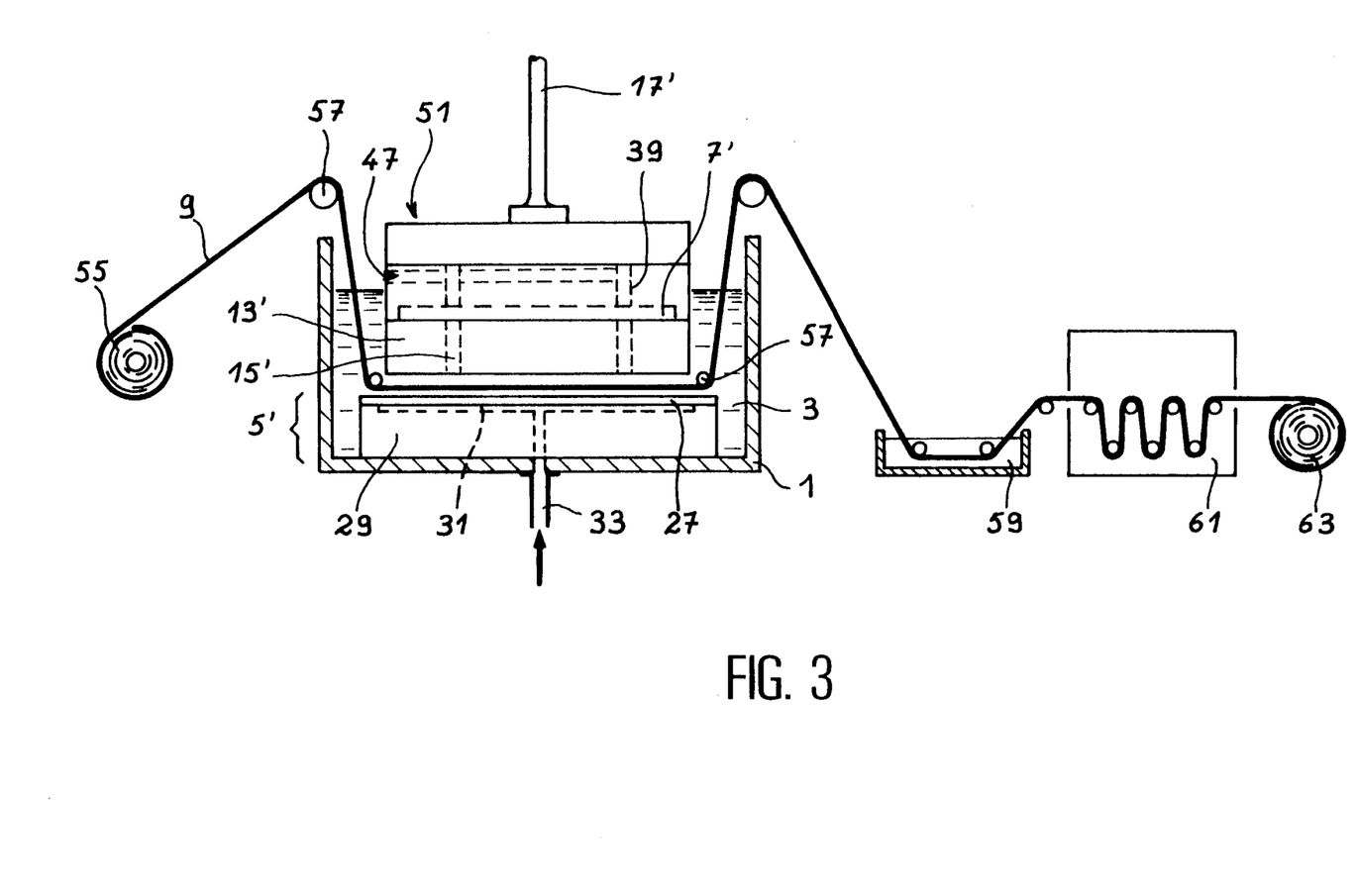
FIG. 3 A diagram illustrating the various stages of the electrolytic deposition process according to the invention.

The motor means 17 can be constituted by a mechanical means such as a screw 19 and a nut 20, as illustrated in FIG. 1, or a not shown spring system, or a pneumatic device diagrammatically illustrated in FIG. 3. When use is made of screws 19, there are preferably three screws on each large side of the mask 13, i.e., six in all.

The second electrode 7 is fixed to the mask 13, so as to form with the latter a space 21 defined by spacing means 22. These means are here constituted by at least one sleeve 23 placed around at least one screw 25. Preferably, there are four screws 25 and sleeves 23 at the four corners of the electrode 7.

Figure 2:
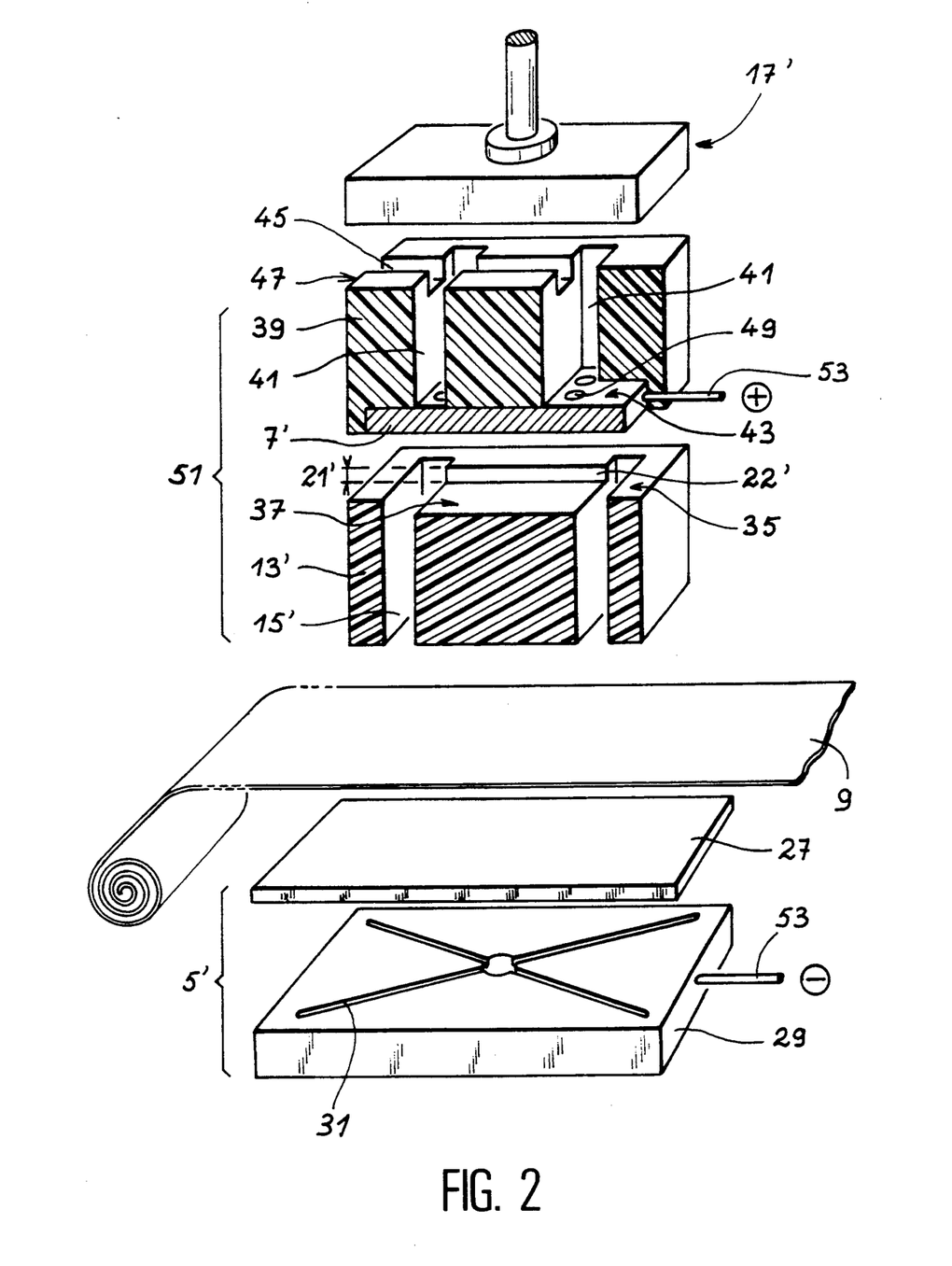
FIG. 2 An exploded, part perspective view of a second embodiment of the apparatus according to the invention.

A second embodiment of the apparatus according to the invention is illustrated in FIG. 2. It has numerous points in common with that described relative to FIG. 1 and only a few structural variants. As a consequence, the elements common to both drawings are given the same references and the common elements having a few variants have the same reference, plus an apostrophe. In FIG. 2, the electrolytic cell 1 is not shown for simplification reasons, but all the elements shown are normally immersed in said electrolyte-filled cell.

The substrate 9 is in the form of a roll, as can be seen in FIG. 2. The first electrode 5' is constituted by a thin sheet 27 of an electrically conductive material, such as e.g., stainless steel, and a base 29. The latter is made from an electrically conductive material and has the same dimensions as the sheet 27. On its upper face the base 29 has grooves 31 communicating with a compressed air intake 33 illustrated only in FIG. 3 and making it possible to engage the sheet 27 against the substrate 9. Finally, said electrode 5' preferably serves as a cathode. Advantageously, the dimensions of the electrode 5' are equal to or larger than those of the mask 13' level with the periphery thereof. In other words, the electrode 5' "projects" round the mask 13". This makes it possible to avoid the electrolyte penetrating between the substrate 9 and the electrode 5' and forming a deposit there.

The mask 13' with the openings 15' has a structure similar to that described relative to FIG. 1. However, its upper face 35, i.e., the face facing the second electrode 7', is hollowed out in its central portion at 37 so as to define on its periphery a peripheral ledge 22' forming a spacing means with the second electrode 7' placed above it. The space between the hollow portion 37 and the electrode 7' is designated 21'. In addition, the hollowed out portion 37 permits the free circulation of the electrolyte 3 between several adjacent openings 15'.

The second electrode 7' serves as an anode and is made from the metal which it is wished to deposit. This electrode 7' is surmounted by a support block 39 made from an electrically insulating material such as polypropylene. Said second electrode 7' is fixed to the support block 39 by means not shown in FIG. 2. Internally, said support block has at least one vertical groove 41 hollowed out from the mass up to the level of the upper surface 43 of the electrode 7'. The two vertical grooves 41 illustrated in FIG. 3 are connected to one another by at least one horizontal groove 45 issuing to the exterior at 47 on one of the side walls of the support block 39.

The second electrode 7' has at least one orifice 49 issuing on the one hand within one of the grooves 41 of the mask 13' and on the other in one of the openings 15'. These orifices 49 permit the discharge of the hydrogen given off during the electrolytic reaction.

The mask 13', the second electrode 7' and the support block 39 are fixed together and form an assembly 51 which can be vertically displaced by means of motor means 17', whose function has been described in connection with FIG. 1. In this particular case, the motor means 17' are constituted by a pneumatic lifting device or piston, shown only diagrammatically here.

Finally, there are two electrical connections 53 at the two respective ends of the second electrode 7' and the base 29. These connections 53 are connected to a not shown generator and make it possible to apply a fixed intensity current to the circuit constituted by the second electrode 7', the electrolyte 3, the substrate to be coated 9 and the first electrode 5'.

FIG. 3 illustrates various stages of the electrolytic deposition process according to the invention. The electrolytic deposition apparatus shown in FIGS. 1 and 2 is shown diagrammatically here and the common elements have the same references.

The substrate 9 is in the form of an initial roll 55. A length of the substrate corresponding to the length of the electrode 5' is unwound between the electrode 5' and the mask 13' within the electrolytic cell 1. In order to correctly traverse the electrolytic cell 1, said substrate 9 passes over four guidance rollers 57.

The assembly 51 formed by the mask 13', the electrode 7' and the support block 39 is lowered into contact with the substrate 9 by the motor means 17'. In addition, the sheet 27 of the first electrode 5' is engaged with the substrate 9 by the injection of compressed air in the orifice 33. Only the openings 15' in the mask 13' and closed at one end by the substrate 9 and at the other by the electrode 7' are filled with electrolyte 3. The level of the electrolyte 3 is controlled in such a way that it completely covers the electrode 7' permitting the emergence of the upper portion of the support block 39 and therefore the end 47 of the groove 45 permitting degassing. To the terminals of the two electrodes is applied a weak voltage for a fixed time. This permits the production of deposits on substrate 9, whose square resistance reaches 10,000 ohms.

This procedure makes it possible to reduce the deposition time. Thus, because the substrate 9 is kept in contact over its entire surface with the sheet 27 resting on the base 29, there is a reduction of the electrical resistance between the current feed and the area where the deposit will be made. This resistance corresponds to the thickness of the substrate 9, i.e., usually to a relatively low resistance. Moreover, the electrical resistance between the current feed (electrode 5') and the area to be coated will be identical at all points, so that there is no need to vary the supply voltage during the deposition phase and this ensures a good homogeneity of the final deposit.

Thus, the deposit only takes place on those portions of the substrate 9 in contact with the electrolyte 3. At the end of the fixed time, the assembly 51 is raised by the motor means 17'. The substrate 9 is then unrolled in such a way that a new substrate length to be treated is placed between the mask 13 and the electrode 5'. Furthermore, the portion of the substrate which already received the electrolytic deposit then undergoes a rinsing stage in a water bath 59, whilst the new substrate length 9 again undergoes the above-described treatment. When the substrate 9 again advances by a length, the portion rinsed in the bath 59 enters a drying device 61, where it is dried before being wound onto the 5 final roll 63.

Several examples of electrolytic deposits according to the invention will now be described.

EXAMPLE 1

ELECTROLYTIC DEPOSIT OF COPPER ON A POLYESTER SUBSTRATE IMPREGNATED WITH A CONDUCTIVE POLYMER

The substrate 9 to be treated has a square resistance of 10 ohms. The electrodes 5,5' are constituted by a copper plate. The mask 13,13' have two rectangular openings 15,15', each having a surface of 3 cm². The electrolyte 3 contained in the cell has a composition of 875 g of $H_2O$, 125 g of $CuSO_4$, $5H_2O$ and 10 g of $H_2SO_4$.

The second electrodes (7,7') also made from copper and forms an anode. It is positioned at a distance of 15 mm from the mask 13,13' (spacer). A current of 1 ampere is passed for 5 minutes into the circuit and the electric power supply is then interrupted. After removing the assembly 51, on the substrate 9 is obtained an adhering copper deposit of 200 mg and of the same size as the two openings 15,15' made in the mask.

EXAMPLE 2

The operating conditions are identical to those of example 1, except that there is a passage of a current of 0.5 A for 10 minutes. An adhering copper deposit of 200 mg is obtained.

EXAMPLE 3

The same operating conditions as in example 1 are used, except that use is made of a current of 2 A for 4 minutes. An adhering copper deposit of 315 mg is obtained.

EXAMPLE 4

The operating conditions are the same as in example 1, except that the cathode 5,5' is made from stainless steel. A current of 2 A is used for 6 minutes and an adhering copper deposit of 450 mg is obtained.

EXAMPLE 5

The operating conditions are the same as in example 1. The substrate 9 is a non-woven fabric impregnated with carbon black and having a square resistance of 2500 ohms. There is a passage of a current of 0.6 A for 6 minutes. An adhering copper deposit of 150 mg is obtained.

EXAMPLE 6

ELECTROLYTIC DEPOSIT OF NICKEL ON A POLYESTER TEXTILE SUBSTRATE COATED WITH A CONDUCTIVE POLYMER

The apparatus used is identical to that of example 1, except that the electrode 5,5' is made from stainless steel. The composition of the electrolyte 3 is 670 g of $H_2O$, 250 g of $NiSO_4$, $7H_2O$, 40 g of $NiCl_2$ and 40 g of $H_3BO_3$.

Throughout the electrolysis, the electrolyte 3 is heated to 60° C. There is a passage of a current of 1 A for 35 minutes. A 20 mg nickel deposit is obtained, having the same shape and dimensions as the two openings 15,15' made in the aforementioned mask.

EXAMPLE 7

ELECTROLYTIC COPPER DEPOSIT ON A TEXTILE SUBSTRATE COVERED WITH AN ANION-DOPED. ELECTRONICALLY CONDUCTIVE ORGANIC POLYMER

Figure 4:
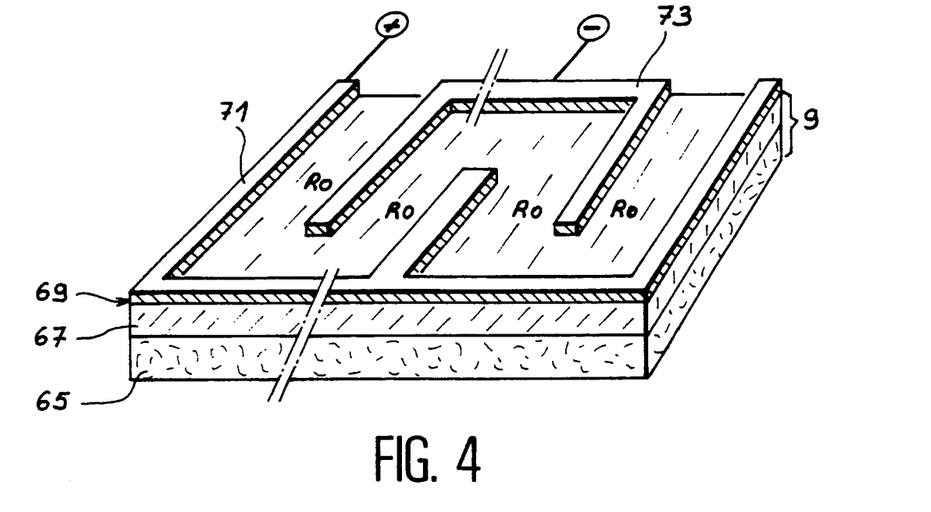
FIG. 4 A perspective view of a first product obtained by the process according to the invention.

As illustrated in FIG. 4, the substrate 9 to be treated is in the form of an electrically insulating, textile support 65, covered with an anion-doped, electronically conductive, organic polymer layer 67. This polymer is formed by a multilayer polypyrrole deposit having a square resistance of 10 ohms.

In order to obtain a heating fabric complying with the required thermal and electrical specifications, it is necessary to deposit a copper layer 69 to form the electrodes 71 and 73. These two electrodes 71 and 73 can be respectively connected to the positive terminal and the negative terminal of an electric power supply, which can be the mains or a battery as a function of the envisaged application.

The two electrodes 71 and 73 must be shaped like two combs facing one another, the teeth of the electrode 71 being engaged in the teeth of the electrode 73, so as to adapt the final resistance of the heating fabric, as a function of the subsequent applications. Thus, the teeth are reciprocally arranged in such a way as to define resistant elements of the same surface and same resistance values $R_o$ (here equal to 5 ohms).

Therefore, the mask 13,13' is provided with openings 15,15', whose shape corresponds to the combs which it is wished to obtain. The operating conditions are identical to those of example 1, except that there is a passage of a current of 0.6 A for 6 minutes. A comb-shaped adhering copper deposit is obtained.

It is, thus, possible to obtain a $1 \times 2$ m heating cover, supplied by a max voltage of 24 V and dissipating a power of 150 $W/m^2$.

EXAMPLE 8

ELECTROLYTIC COPPER DEPOSIT ON A TEXTILE SUPPORT COVERED WITH A DOPED. ELECTRONICALLY CONDUCTIVE. ORGANIC POLYMER WITH A VIEW TO THE MANUFACTURE OF A GLOVE

Figure 5:
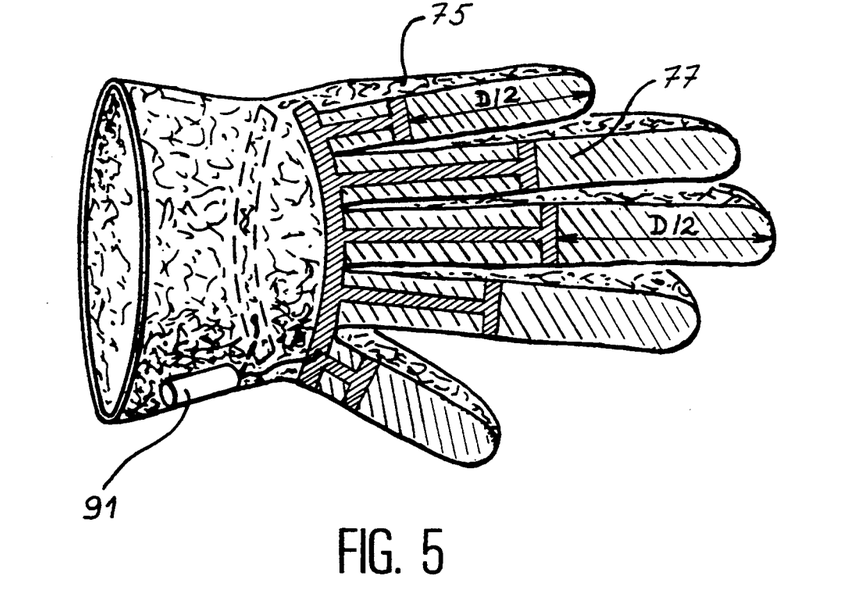
FIG. 5 A perspective view of a second product obtained by the process according to the invention, i.e., a heated glove.

The aim of this example is to produce a heated glove, like that illustrated in FIG. 5. The glove 75 is made from an electrically insulating textile such as cotton or wool. Heating elements 77 are produced by the deposition according to the invention and are subsequently added to the glove. These heating elements are produced from a fabric 79, like that illustrated in FIG. 6. This fabric comprises a doped, electronically conductive, organic polymer substrate 81 on which have been formed copper deposits 83 in order to constitute electrodes. Each deposit takes place on the two opposite, lateral edges of the fabric 79, in the form of a continuous strip 85 parallel to the longitudinal axis of the fabric and extended towards the median portion of the fabric 79 by T electrodes 87 perpendicular to the strip 85. Deposition takes place by the process according to the invention. The masks 13,13' consequently have a specific shape adapted to this type of deposit. The operating conditions are identical to those of example 1, except that there is a passage of a 1.2 A current for 6 minutes.

Figure 6:
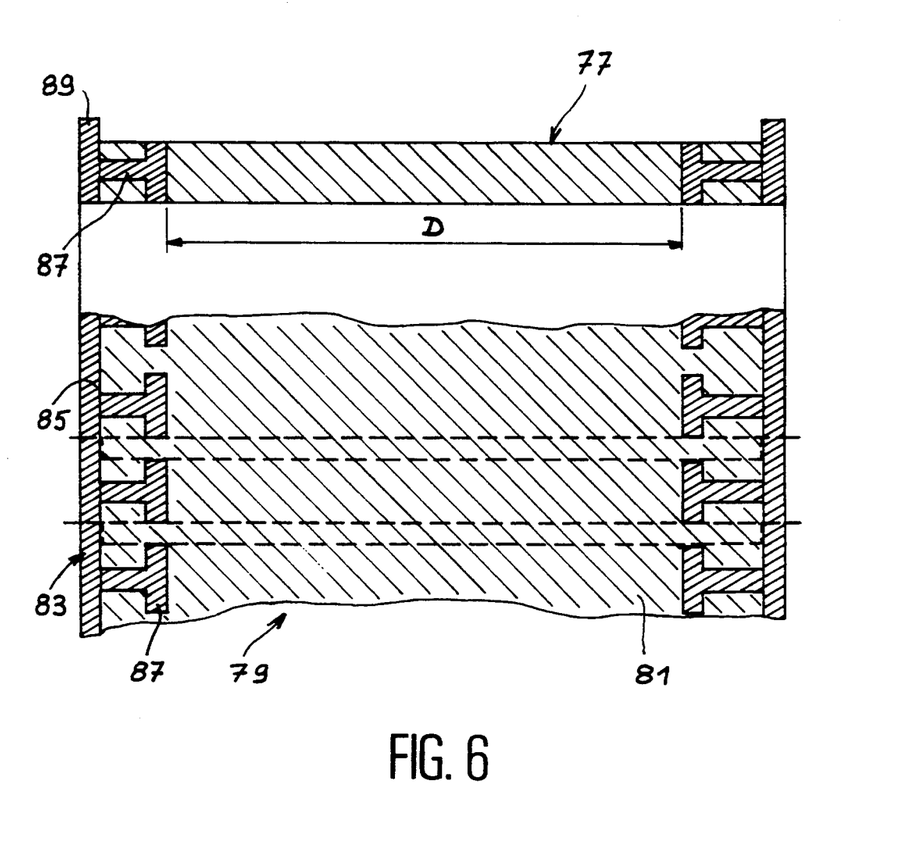
FIG. 6 A diagram illustrating a fabric used in the production of said glove.

The fabric 79 is then cut in accordance with the dotted lines in FIG. 7, so as to obtain unitary heating elements 77, like that shown in the upper part of FIG. 6. This cutting takes place in such a way as to form lateral tongues 89 for each electrode 87. Each heating element 77 is then folded into two and sewn onto a finger of the glove, ensuring that each lateral tongue 89 of an element 87 covers the strip portion 85 of the contiguous heating element. This ensures the continuity of the electric circuit and the parallel connection of the heating element 77. The electric supply of the element 77 is provided by a battery 91.

In order to have a good heating uniformity for each finger, the distance D between the end of the two electrodes 87 must be identical for each glove finger. Thus, there is an adjustment of each electrode 87 as a consequence thereof, during the manufacture of the fabric (cf. FIG. 5).

This makes it possible to obtain a heated glove enabling the temperature of the end of the fingers to be raised to a value above 28° C. for an external temperature of 0° C. It should be noted that the T shape of each electrode 87 (i.e., in its centre) enables the user to bend the fingers more easily.

What is claimed is:

1. Apparatus for electrolytic semi-continuous deposition of a metal on a weakly conductive, flexible substrate characterized in that it comprises an electrolytic cell having a first and second planar electrodes placed in said electrolytic cell and a t least one element forming a mask placed between and spaced from the two electrodes where the substrate is placed between one of the electrodes and the mask, said mask is rigid and made from an electrically insulating material having at least one opening with the shape of the deposit which it is to produce on said substrate and is provided with motor means permitting the displacement thereof in a direction normal to plan of the substrate between a first position where it is remote from the substrate to be treated and a second position where it is engaged on said substrate.

2. Electrolytic deposition apparatus according to claim 1, characterized in that the second electrode is fixed to the mask to form therewith a space defined by spacing means.

3. Electrolytic deposition apparatus according to claim 2, characterized in that the spacing means are formed by at least one sleeve placed round at least one screw fixing the second electrode to the mask.

4. Electrolytic deposition apparatus according to claim 2, characterized in that the face of the mask positioned facing the second electrode is hollowed out in its central portion to define on its periphery a ledge forming said spacing means.

5. Electrolytic deposition apparatus according to claim 1, wherein the second electrode is fixed beneath a support block made from an electrically insulating material and said support block comprises at least one groove hollowed in its mass and connecting an upper face of the second electrode to an exterior of said support block, said second electrode having at least one orifice issuing into one of the said grooves.

6. Electrolytic deposition apparatus according to claim 1, characterized in that the motor means are formed by at least one screw and at least one bolt.

7. Electrolytic deposition apparatus according to claim 1, characterized in that the motor means are formed by pneumatic jacks.

8. Electrolytic deposition apparatus according to claim 1, characterized in that the first electrode is formed from a sheet of electricity conducting material and a base provided with compressed air means permitting the engagement of said sheet with the substrate.

9. Electrolytic deposition apparatus according to claim 8, characterized in that the dimensions of the first electrode are equal to or greater than those of the mask level with the periphery of said mask.

10. Electrolytic deposition apparatus according to claim 1, characterized in that the dimensions of the first electrode are equal to or greater than those of the mask level with the periphery of said mask.

11. Electrolytic deposition apparatus according to claim 1, characterized in that the first electrode is a cathode and the second electrode is an anode made from copper or nickel.

12. Process for the electrolytic semi-continuous deposition of a metal on a weakly conductive, flexible substrate in the form of a continuous strip, characterized in that it comprises the following stages:
   a) immersing said substrate in an electrolytic cell filled with an electrolyte, said weakly conductive, flexible substrate is positioned between a first planar electrode and a second planar electrode which are also placed in said electrolytic cell, at least one of the said two electrodes is made from the metal which is to be deposited and constituting an anode;
   b) maintaining one face of said substrate in contact with said first electrode;
   c) placing between an opposite face of said substrate and the second electrode, an element made from an electrically insulating material and forming a mask, said mask is rigid and having at least one opening corresponding to the shape of the deposit which it is to produce on said substrate;
   d) moving said mask in a direction normal to the plan of the substrate to engage it against said opposite face of the substrate by motor means so that there is no electrolyte between the mask and the substrate;
   e) applying a low voltage between the first and second electrodes to produce the deposit;
   f) removing the mask in a direction normal to the plan of the substrate using said motor means to obtain the substrate covered with the deposit;
   g) passing the substrate semicontinuously between the first electrode and the mask and repeating stages d) to f) on successive portions of said substrate.

13. Process according to claim 12, wherein the substrate is formed of an electrically insulating textile support covered with a doped, electronically conductive, organic polymer and wherein the opening of the mask corresponds to the shape of at least two electrodes.

14. Process according to claim 12, wherein the mask comprises two openings, each opening is shaped like a comb with teeth and each opening positioned facing one another with the teeth of one opening engaged in the teeth of the other opening.

15. Process according to claim 12, wherein the substrate is a doped, electronically conductive, organic polymer and wherein the mask has two openings, each of the openings being shaped to deposit metal on at least one lateral edge of said substrate and from the at least one lateral edge toward a median portion of the substrate to form electrodes.

16. Process according to claim 15, wherein the electrodes are T-shaped.

* * * * *